(12) United States Patent
Rofougaran

(10) Patent No.: US 8,774,740 B2
(45) Date of Patent: *Jul. 8, 2014

(54) POWER CONTROL FOR POWER AMPLIFIERS

(71) Applicant: Broadcom Corporation, Irvine, CA (US)

(72) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/922,043

(22) Filed: Jun. 19, 2013

(65) Prior Publication Data

US 2013/0278339 A1    Oct. 24, 2013

Related U.S. Application Data

(63) Continuation of application No. 13/564,152, filed on Aug. 1, 2012, now Pat. No. 8,472,899, which is a continuation of application No. 12/616,092, filed on Nov. 10, 2009, now Pat. No. 8,238,851, which is a continuation of application No. 11/678,797, filed on Feb. 26, 2007, now Pat. No. 7,616,941.

(51) Int. Cl.
    *H04B 1/04*     (2006.01)
    *H01Q 11/12*    (2006.01)

(52) U.S. Cl.
    USPC ............ 455/127.1; 455/232.1; 455/292; 455/341; 455/343.1; 455/522

(58) Field of Classification Search
    USPC ........ 455/127.1, 232.1, 292, 341, 343.1, 522, 455/127.2, 127.3, 127.4, 342, 226.1, 236.1, 455/239.1, 240.1, 234.1, 67.11, 550.1, 455/553.1, 107, 108, 252.1, 293, 311, 333
    See application file for complete search history.

(56) References Cited

U.S. PATENT DOCUMENTS

| | | | |
|---|---|---|---|
| 6,809,581 B2 * | 10/2004 | Rofougaran et al. | 327/563 |
| 7,154,331 B2 | 12/2006 | Zaguri | |
| 7,202,734 B1 * | 4/2007 | Raab | 330/126 |
| 7,286,011 B2 | 10/2007 | Chang | |
| 7,286,015 B2 | 10/2007 | Zochios | |
| 7,355,470 B2 * | 4/2008 | Sorrells et al. | 330/2 |
| 7,616,941 B2 * | 11/2009 | Rofougaran | 455/341 |
| 7,729,683 B2 * | 6/2010 | Rofougaran | 455/341 |
| 8,283,950 B2 | 10/2012 | Willey | |
| 8,289,796 B2 | 10/2012 | Lee | |
| 2005/0285674 A1 * | 12/2005 | Zaguri | 330/254 |
| 2008/0164941 A1 * | 7/2008 | Lee et al. | 330/124 R |

* cited by examiner

*Primary Examiner* — Pablo Tran
(74) *Attorney, Agent, or Firm* — Oblon, Spivak, McClelland Maier & Neustadt, L.L.P.

(57) ABSTRACT

Aspects of a system for improving efficiency over power control for linear and class AB power amplifiers may include a current source circuit that enables determination of a bias current level for a PA circuit within an IC die based on an amplitude of an input modulation signal. The PA circuit may enable generation of an output signal based on a differential input signal and the input modulation signal to the current source circuit. A generated bias voltage may be applied to a transformer external to the IC die, but internal to an IC package containing the IC die and/or a circuit board containing the IC package. One or more amplifier bias voltage levels may be applied to the PA circuit wherein the amplifier bias voltage levels may be derived from the generated bias voltage level and/or the determined bias current level.

20 Claims, 3 Drawing Sheets

POWER CONTROL FOR POWER AMPLIFIERS

This is a continuation of application Ser. No. 13/564,152 filed Aug. 1, 2012.

This is a continuation of application Ser. No. 12/616,092 filed Nov. 10, 2009.

CROSS-REFERENCE TO RELATED APPLICATIONS/INCORPORATION BY REFERENCE

This application is a continuation of U.S. application Ser. No. 11/678,797 filed Feb. 26, 2007.

This application makes reference to U.S. application Ser. No. 11/678,790 filed on Feb. 26, 2007, which is hereby incorporated herein by reference in its entirety.

FIELD OF THE INVENTION

Certain embodiments of the invention relate to communication networks. More specifically, certain embodiments of the invention relate to a method and system for improving efficiency over power control for linear and Class AB power amplifiers.

BACKGROUND OF THE INVENTION

A power amplifier (PA) circuit may be biased for different modes, or "classes" of operation. Exemplary classes include Class A, Class AB, and Class B. In Class A operation, a PA may be biased such that the PA is in a conducting, or ON, state during 100% of the cycle, or the entire cycle, of the input signal. The bias level is also typically selected such that the PA operates in the most linear portion of the transfer curve, which characterizes the PA circuit. In Class A operation, the output signal from the PA is typically a scaled version of the input signal, where the scaling factor is a function of the gain associated with the PA circuit. However, because of the bias level utilized for Class A operation, the PA is typically in a conducting state even when there is no input signal. Furthermore, even when the PA is amplifying an input signal, the efficiency of the PA may not exceed 50%. For example, each watt of delivered output power, or $P_{out}$, may require two (2) watts of delivered power, $P_{DC}$, from a DC power supply source (such as a battery). One limitation of conventional Class A PA circuits for use in mobile wireless communication systems like wireless local area network (WLAN) systems is that high bias levels often utilized to enable large variations in output power levels may result in unacceptably short battery life and/or high levels of generated thermal heat.

In Class B operation, a PA may be biased such that the PA is in a conducting state during 50%, or half, of the cycle of the input signal. This may result in large amounts of distortion of the input signal in the output signal. In this regard, in Class B operation, the PA may operate in a nonlinear portion of the transfer curve. However, the theoretical efficiency of a Class B PA circuit may reach 78.5%. The higher efficiency of the Class B PA results from the PA being in a non-conducting, or OFF, state half of the time. While the PA is in the OFF state, power dissipation may be theoretically zero (0). One limitation of Class B PA circuits is that distortion levels in output signals may be unacceptably high.

In Class AB operation, a PA may be biased such that the PA is in a conducting state for greater than 50%, but less than 100%, of the cycle of the input signal. In Class AB operation, the PA may be more efficient than in Class A operation, but less efficient than in Class B operation. Furthermore, in Class AB operation, the PA may produce more distortion than in Class A operation, but less than in Class B operation.

In Class C operation, a PA may be biased such that the PA is in a conducting state for less than 50% of the cycle of the input signal. While Class C amplifiers may produce more distortion than Class A, Class AB, or Class B amplifiers, the theoretical efficiency of a Class C amplifier may reach 90%. The Class C amplifier may receive an input signal and generate a series of current pulse signals. The current pulse signals generated by the Class C amplifier may comprise undesired frequency components. The output signal from the Class C amplifier may be input to a tuned circuit, which may comprise circuitry to suppress unwanted frequency components. The resulting output signal from the tuned circuit may be a signal for which that comprises frequencies within a desired frequency band, for example such as a frequency band utilized in global system for mobile (GSM) communications systems.

While the operating class of a PA provides one measure of efficiency, another measure of efficiency is determined by how efficiently the output power from the PA, $P_{out}$, is delivered to a load. For purposes of the present application, this measure of efficiency may be referred to as load transfer efficiency. In a wireless communications system, an exemplary load may comprise an antenna. The PA may deliver the output power to the load most efficiently when the output impedance of the PA is equal to the impedance of the load. In this regard, the PA and the load may be referred to as being "impedance matched".

Many conventional PA circuits are implemented in integrated circuit (IC) devices, or chips. The IC may comprise a die, which may comprise active and/or passive circuitry, and a package, which may comprise a plurality of pins, or contacts, which enable electrical conductivity between various contact points on the die, and various contact points on a board, or other electronic assembly on which the IC is installed.

Some conventional PA integrated circuit chips achieve impedance matching by insertion of an on-chip transformer between the output of the PA and a load, which is located off-chip. A transformer utilized for impedance matching may be referred to as a matching transformer. Because of limitations in on-chip transformer circuits, signal energy may be lost when coupling a signal from the primary windings of the on-chip transformer to the secondary windings of the on-chip transformer. The result may be a reduced level of delivered power to the load, $P_{load}$.

In a polar modulation system, the PA input may comprise a phase modulation signal and an amplitude signal. In response to the phase modulation signal, the PA may generate an output signal of constant amplitude for which the phase may vary at different time instants. In response to the amplitude modulation signal, the PA may vary the amplitude at different time instants for the signal generated in response to the phase modulation signal.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for improving efficiency over power control for linear and Class AB power amplifiers, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for improving efficiency over power control for linear and Class AB power amplifiers. Various embodiments of the invention may improve PA efficiency, and load transfer efficiency. PA efficiency may be improved by dynamically changing the bias voltage level in response to dynamic changes in the amplitude of the input signal applied to the PA. In addition, PA efficiency may be improved by dynamically changing a bias current level, $I_{Bias}$, flowing through the PA. In various embodiments of the invention, the bias current level may be determined by setting programmable bits in a current source circuit. The programmable bits, or power control bits, may determine a power level for the output of the PA. For a PA utilized in polar modulation applications, the current source circuit may receive an input modulation signal, which may enable control of the amplitude of an output signal generated by the PA. By dynamically controlling the bias voltage level and bias current level of the PA, the PA may be configured to operate as a Class A amplifier, a Class B amplifier, a Class AB amplifier, and/or a Class C amplifier, for example.

In various embodiments of the invention, load transfer efficiency may be improved by implementing the PA circuit in an IC die, while implementing the matching transformer in the IC package surrounding the die. By placing the matching transformer in the IC package, materials may be utilized with higher permeability, and lower parasitic resistance and/or capacitance values. The result may be a transformer, for which less signal energy may be lost while coupling a signal from the primary transformer winding to the secondary transformer winding. The dynamically changed $P_{DC}$ bias level may be applied to the matching transformer, which may in turn enable dynamic biasing of the PA circuit. In various alternative embodiments of the invention, the matching transformer may be located in a board on which the IC may be installed.

Figure 1:
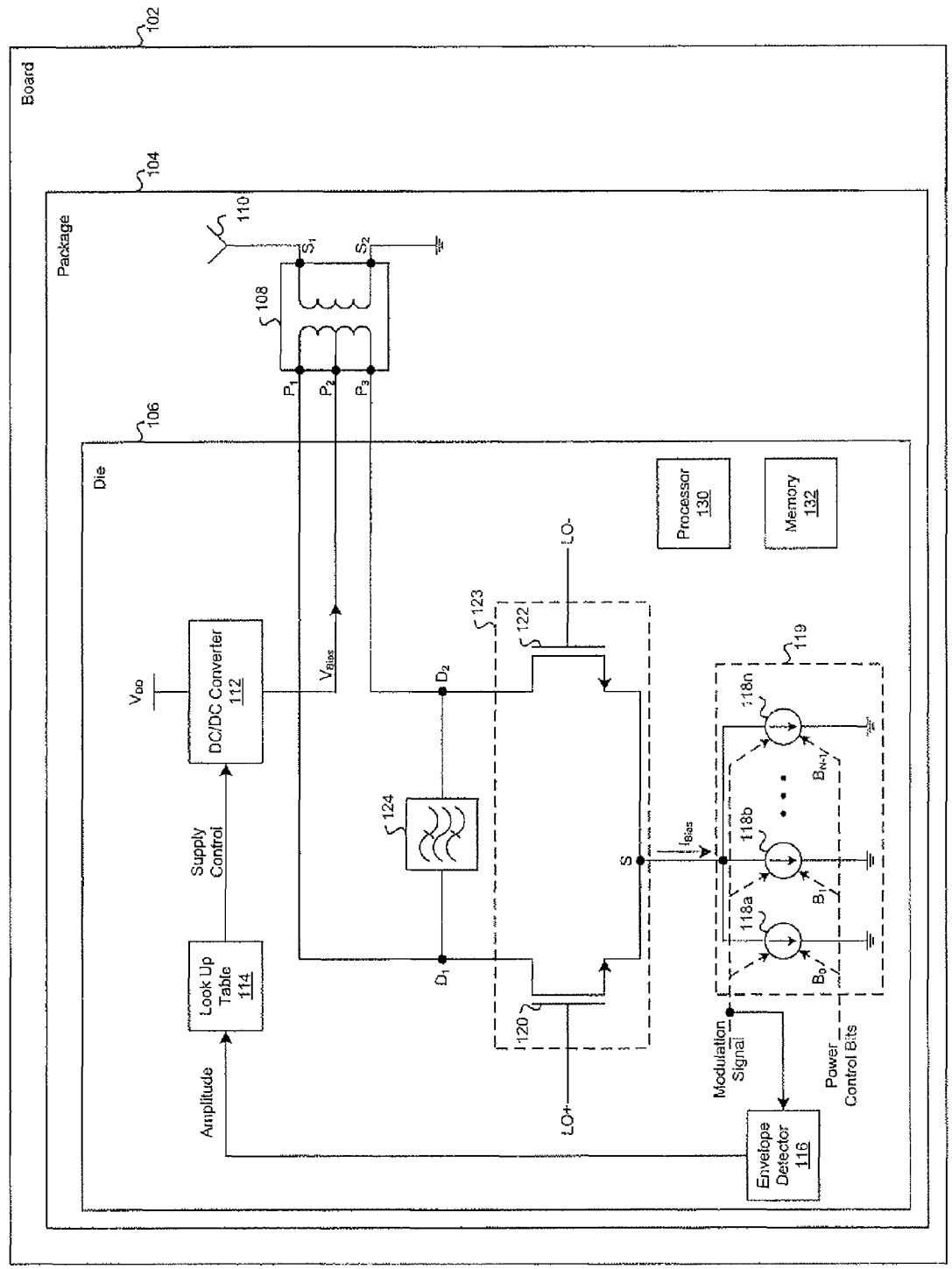
FIG. 1 is a diagram of a power amplifier with dynamic biasing and bias current control, in accordance with an embodiment of the invention.

FIG. 1 is a diagram of a power amplifier with dynamic biasing and bias current control, in accordance with an embodiment of the invention. Referring to FIG. 1, there is shown a board 102. The board 102 may comprise an IC package 104. The IC package 104 may comprise a die 106, a matching transformer 108, and an antenna 110. The die 106 may comprise a DC to DC (DC/DC) converter 112, a look up table (LUT) 114, an envelope detector 116, a current source 118, transistors 120 and 122, a filter 124, a current source 119, a processor 130, and a memory 132. The current source 119 may comprise a plurality of current source modules 118a, 118b, and 118n. In an exemplary embodiment of the invention, the transistors 120 and 122 may be fabricated by utilizing CMOS technology.

The package 104 may comprise a plurality of pins, or other contact points, each of which may enable electrical conductivity from a contact point on the die 106, to a contact point on the board 102. The package 104 may utilize any of a variety of technologies for enclosing a die 106.

Within in the die 106 the DC/DC converter 112 may comprise suitable logic, circuitry and/or code that may enable conversion of an input supply voltage, $V_{DD}$, to a bias voltage, $V_{Bias}$, based on an input control signal, Supply Control. The voltage level for the bias voltage $V_{Bias}$ may be less than or equal to the voltage level of the input supply voltage $V_{DD}$. In an exemplary embodiment of the invention, the DC/DC converter 112 may comprise a switching regulator circuit.

The envelope detector 116 may comprise suitable logic, circuitry and/or code that may enable detection of an amplitude of a time varying input signal, labeled as the differential signal LO+ and LO− in FIG. 1. Based on the detected amplitude of the input signal, the envelope detector 116 may enable representation of the detected input signal amplitude in a generated output signal labeled Amplitude in FIG. 1. In various embodiments of the invention, the signal Amplitude may be an analog signal and/or a digital signal.

The LUT 114 may comprise suitable logic, circuitry and/or code that may enable generation of a Supply Control code word based on an input Amplitude signal. In an exemplary embodiment of the invention, the LUT 114 may comprise one or more memory circuits that utilize the Amplitude signal to generate an address to access a memory location. Based on the binary data retrieved from the address memory location, the Supply Control code word may be generated.

The current source 119 may comprise suitable logic, circuitry and/or code that may enable generation of a bias current, $I_{Bias}$. The bias current $I_{Bias}$ may represent an aggregate current generated by a plurality of individual current source modules 118a, 118b, . . . , and 118n. The aggregate current level for the current source 119 may be measured at the node labeled S in FIG. 1. The current source 119 may receive an input modulation signal, and an input power control bits signal. The input power control bits signal may enable control of the bias current level generated by the current source 119. The input power control bits signal may comprise a plurality of bits $B_0, B_1, \ldots,$ and $B_{N-1}$. The input modulation signal may enable the bias current level generated by the current source 119 to vary at different time instants in response to changes in a level of the input modulation signal.

The current source module 118a may comprise suitable logic, circuitry and/or code that may enable generation of a current, $I_0$, in response to a bit, $B_0$, from the input power control bits signal. In an exemplary embodiment of the invention, the current source module 118a may be configured in an ON state, or in an OFF state, based on a value of the bit $B_0$. For example, when $B_0=1$ the current source module 118a may be in an ON state, and when $B_0=0$ the current source module 118a may be in an OFF state. When the current source module 118a is in an OFF state $I_0=0$. When the current source module 118a is in an ON state, the current level for the current $I_0$ may vary at different time instants in response to changes in the level of the input modulation signal.

The current source module 118b may comprise suitable logic, circuitry and/or code that may enable generation of a current, in response to a bit, $B_1$, from the input power control bits signal. The current source module 118b may be configured in an ON state, or in an OFF state, based on a value of the bit $B_1$. For example, when $B_1=1$ the current source module 118b may be in an ON state, and when $B_1=0$ the current source module 118b may be in an OFF state. When the current source module 118b is in an OFF state $I_1=0$. When the current source module 118b is in an ON state, the current level for the current $I_1$ may also vary at different time instants in response to changes in the level of the input modulation signal.

The current source module 118n may comprise suitable logic, circuitry and/or code that may enable generation of a current, $I_n$, in response to a bit, $B_{N-1}$, from the input power control bits signal. The current source module 118n may be configured in an ON state, or in an OFF state, based on a value of the bit $B_{N-1}$. For example, when $B_{N-1}=1$ the current source module 118n may be in an ON state, and when $B_{N-1}=0$ the current source module 118n may be in an OFF state. When the current source module 118n is in an OFF state $I_{N-1}=0$. When the current source module 118n is in an ON state, the current level for the current $I_{N-1}$ may vary at different time instants in response to changes in the level of the input modulation signal.

The transistors 120 and 122 may form a differential power amplifier (PA) circuit 123 that receives a differential input signal, labeled LO+ and LO−, and generated an amplified output signal at the nodes labeled $D_1$ and $D_2$. The input LO+ may be applied to the gate of the transistor 120, and the input LO− may be applied to the gate of the transistor 122. The node $D_1$ may be coupled to the drain of the transistor 120, and the node $D_2$ may be coupled to the drain of the transistor 122.

The filter 124 may comprise suitable logic, circuitry and/or code that may suppress signals within one or more specified frequency ranges. In an exemplary embodiment of the invention, the filter 124 may comprise a bandpass filter that may suppress frequency components in the differential signal at the nodes $D_1$ and $D_2$, which are outside of a pass band for the filter 124.

The matching transformer 108 may comprise primary windings labeled $P_1$, $P_2$ and $P_3$ in FIG. 1, and secondary windings labeled $S_1$ and $S_2$. The primary and secondary windings may comprise electrically conducting material, such as wire manufactured from a suitable metal or conductor, and a core manufactured from a suitable magnetically permeable material. The location of the matching transformer 108 in the package 104 may enable the utilization of materials, which may not be utilized for the manufacture of matching transformers, which are located on a die. In addition, the location of the matching transformer 108 in the package 104 may enable the realization of physical dimensions, which may not be achievable for matching transformers, which are located on a die. The combination of wider material choice, and wider choice of physical dimension, may enable more efficient transfer of signal energy from the primary windings to the secondary windings in the matching transformer 108, than may be achievable with matching transformers, which are located on a die.

In the context of the present application, the processor 130 may enable generation of power control bits that may be utilized for dynamic control of an aggregate bias current level flowing through the PA 123, for example. In addition, the processor 130 may enable generation of data, which may be stored in the LUT 114.

The memory 132 may comprise suitable logic, circuitry and/or code that may enable storage and/or retrieval of data and/or code. The memory 132 may utilize any of a plurality of storage medium technologies, such as volatile memory, for example random access memory (RAM), and/or non-volatile memory, for example electrically erasable programmable read only memory (EEPROM). In the context of the present application, the memory 132 may enable storage of code that enables generation of power control bits and/or data for storage in the LUT 114, for example.

In an exemplary embodiment of the invention, the package 104 may be a flip chip package, containing the matching transformer 108 and antenna 110, to which the die 106 may be bonded. A contact point for the drain of transistor 120, labeled $D_1$ in FIG. 1, may be coupled to a contact point for the primary winding of the matching transformer 108, labeled $P_1$ in FIG. 1. A contact point for the drain of transistor 122, labeled $D_2$ in FIG. 1, may be coupled to a contact point for the primary winding of the matching transformer 108, labeled $P_3$ in FIG. 1. A contact point for the output of the DC/DC converter 112 may be coupled to a contact point for the primary winding of the matching transformer 108, labeled $P_2$ in FIG. 1. A contact point for the secondary winding of the matching transformer 108, labeled $S_1$ in FIG. 1, may be coupled to the antenna 110. A contact point for the secondary winding of the matching transformer 108, labeled $S_2$ in FIG. 1, may be coupled to ground.

In operation, the PA 123 may be utilized in a polar modulation system in which the signal phase may be represented by the differential input signal LO+ and LO−, and the signal amplitude represented by the modulation signal as shown in FIG. 1. The differential input signal LO+ and LO−, which may be applied to the gates of the transistors 120 and 122, respectively, may represent a phase modulation signal of constant amplitude. An amplified version of the differential input signal LO+ and LO−, $V_{out}$, may be generated at the output of the PA 123, as measured at the nodes labeled $D_1$ and $D_2$. The amplitude of the output signal $V_{out}$ may vary at different time instants in response to changes in the level of the modulation signal applied to the input of the current source 119. Consequently, the dynamic bias voltage level for the PA 123 may be determined based on the modulation signal. The amplitude corresponding to the modulation signal may be detected by the envelope detector 116. The output of the envelope detector 116 may represent the detected modulation signal amplitude via the signal, Amplitude, The LUT 114 may generate a Supply Control signal based on the Amplitude signal. The DC/DC converter 112 may convert the supply voltage $V_{DD}$ to a bias voltage $V_{Bias}$ based on the Supply Control signal. The bias voltage may be applied to the matching transformer 108 at the point labeled $P_2$. In response, the bias voltage may be applied to the drain of the transistor 120, via the contact point $D_1$, and the drain of the transistor 122, via the contact point $D_2$. The bias voltage applied at the contact point $D_1$ may provide a bias voltage to the transistor 120 while the bias voltage applied at the contact point $D_2$ may provide a bias voltage to the transistor 122.

In addition to dynamic control of a bias voltage level for the PA 123, in various embodiments of the invention, the current source 119 may be programmable to enable dynamic control of a bias current level for the PA 123. In this regard, the processor 130 may enable generation of power control bits, which may be provided as an input to the current source 119. Each of the power control bits, $B_0$, $B_1$, . . . , and $B_{N-1}$ may enable a corresponding current source module 118a, 118b, . . . , and 118n to operate in an ON state or in an OFF state. The bias current level flowing through the PA 123 may be represented as in the following equation:

$$I_{Bias} = I_{reg} \cdot \sum_{k=0}^{N-1} I_k \qquad [1]$$

where $I_{ref}$ may represent a constant reference current value:

$$I_k = B_k 2^k \qquad [2]$$

The bias current level $I_{Bias}$ may also vary at different time instants in response to changes in the level of the modulation signal. These changes in the bias current level may be reflected in corresponding changes in the level of the signal, $V_{out}$, generated by the PA 123.

In various embodiments of the invention, the envelope detector 116 may operate in conjunction with the processor 130 to determine a bias voltage level and/or bias current level for the PA 123.

In various embodiments of the invention, the LUT 114 may enable the PA 123 to operate in various classes. For example, the LUT 114 may enable the dynamic selection of bias levels $V_{Bias}$, which enable the transistors 120 and 122 to operate in the linear portion of the respective transfer curves for the given amplitude of the modulation signal, such as in a Class A amplifier. The dynamic biasing method, however, may enable the PA 123 to operate with increased efficiency compared to conventional Class A amplifier designs because the bias level, and power consumption of the PA 123, may be increased and/or decreased in response to the amplitude of the modulation signal. Alternatively, the LUT 114 may enable the dynamic selection of bias levels, which may enable the PA 123 to operate as a Class B amplifier, a Class AB amplifier, or a Class C amplifier, for example. In various embodiments of the invention, the power control bits signal may operate in conjunction with the LUT 114 to further increase the efficiency of the PA 123 by enabling control over both the bias voltage level, and/or bias current level.

The output voltage from the PA 123, $V_{out}$, may be measured between the nodes $D_1$ and $D_2$. The corresponding output current, as supplied via the DC/DC converter 112, may be $I_{Bias}$. The output power from the PA 123, $P_{out}$, may be proportional to the multiplicative product $V_{out} \cdot I_{Bias}$. The matching transformer 108 may transfer the output power from the PA 123, $P_{out}$, measured at the primary windings between nodes $P_1$ and $P_2$, and transfer at least a portion of $P_{out}$, $P_{load}$, to the secondary windings as measured between the nodes $S_1$ and $S_2$. The portion of power which may be transferred from the primary windings to the secondary windings depends upon signal energy loss between the primary windings and secondary windings of the matching transformer 108, $P_{loss}$, as shown in the following equation:

$$P_{load} = P_{out} - P_{loss} \quad [3]$$

In various embodiments of the invention, the matching transformer 108 may be located within the package 104 as opposed to being located within the die 106. Locating the matching transformer 108 external to the die 106 may enable implementation of more efficient matching transformer designs for which signal energy loss may be lower in comparison to some conventional IC designs in which the PA 123 and matching transformer are located within an IC die. The matching transformer 108 may realize the higher efficiency by utilizing high permeability core materials and/or low resistance, low parasitic parameter materials for the primary and secondary windings. In various embodiments of the invention $P_{load} \approx P_{out}$.

The voltage $V_{out}$ may induce a proportional voltage, $V_A$, across the secondary windings of the matching transformer as measured at nodes $S_1$ and $S_2$ respectively. The voltage $V_A$ may correspond to a voltage applied to the antenna 110. The antenna 110 may correspond to a load impedance, $R_L$. Similarly, the current $I_{Bias}$ may induce a proportional current, $I_{load}$, through the load impedance $R_L$. Consequently, the voltage $V_A$ may be proportional to the current $I_{Bias}$, while the power transferred to the antenna, $P_{load}$, may be proportional to $I_{Bias}^2$.

Changes in the voltage level for $V_{out}$ may result in corresponding changes in the current level for $I_{Bias}$. In turn, this may result in corresponding changes in the voltage level for $V_A$. For some IC fabrication technologies, such as CMOS, the impedance of the transistors 120 and 122 may be relatively small (as measured in ohms). In addition, the technology may require that changes, or swings, in the voltage levels for $V_{out}$ be limited. By contrast, the impedance of the antenna 110, may be considerably larger, for example $R_L = 50$ ohms. By utilizing the matching transformer 108 to provide impedance matching between the impedance of the PA 123, as measured between the nodes $D_1$ and $D_2$, and the impedance of the antenna 110, $R_L$, voltage level swings in $V_{out}$ may be limited.

Figure 2:
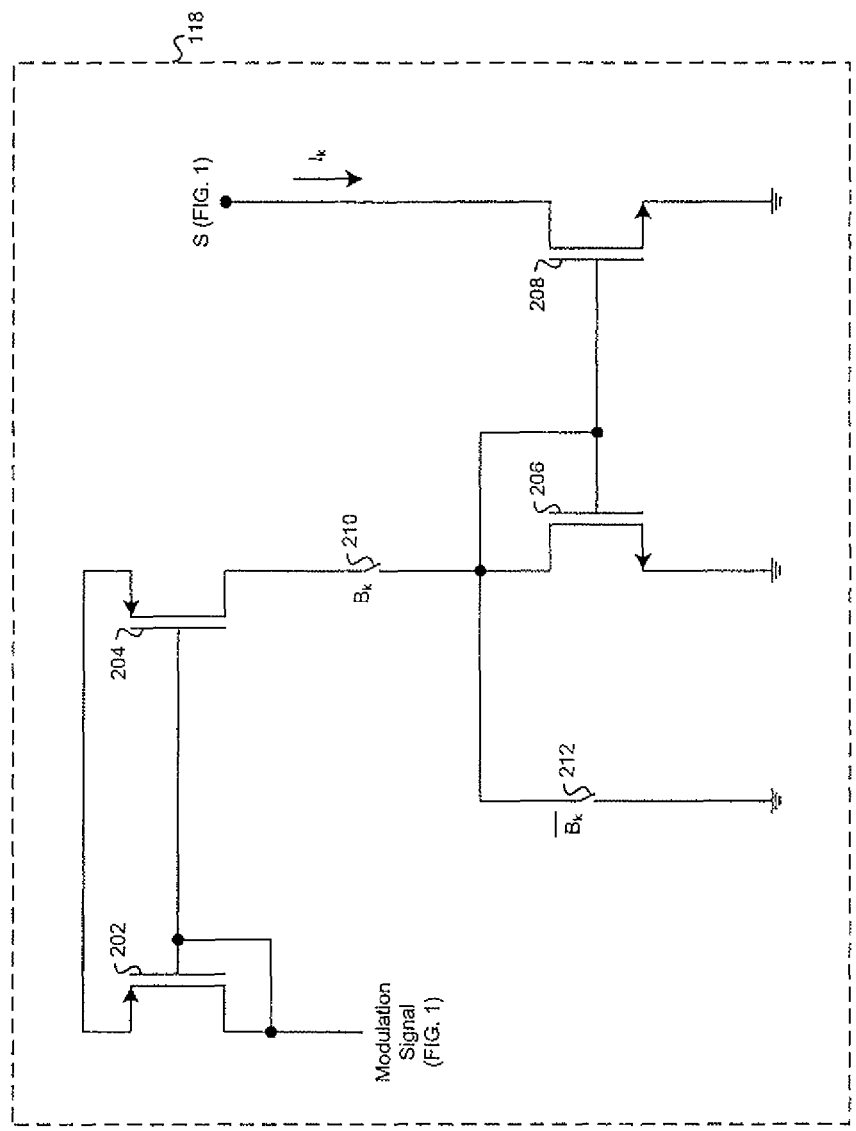
FIG. 2 is a diagram of an exemplary bias current control circuit, in accordance with an embodiment of the invention.

FIG. 2 is a diagram of an exemplary bias current control circuit, in accordance with an embodiment of the invention. Referring to FIG. 2, there is shown a current supply module 118. The current supply module 118 may represent any one of the current supply modules 118a, 118b, . . . , or 118n shown in FIG. 1. The current supply module 118 may comprise a plurality of transistors 202, 204, 206 and 208, and a plurality of contact switches 210 and 212. The transistors 202 and 204 may be configured as a current mirror circuit, and the transistors 206 and 208 may be configured as a second current mirror circuit. The drain of the transistor 208 may be coupled to the node labeled S, as shown in FIG. 1. The drain of the transistor 202 may be coupled to the input modulation signal, as shown in FIG. 1. The contact switch 210 may be configured in an OPEN or CLOSED state based on a power control bit $B_k$, where k may have a value 0, 1, . . . , or N-1, for example. The contract switch 212 may be configured in an OPEN or CLOSED state based on the binary complement value of the power control bit $B_k$. As such, the contact switch 210 may be configured in an OPEN state, when the contact switch 212 is configured in a CLOSED state. In addition, the contact switch 210 may be configured in a CLOSED state, when the contact switch 212 is configured in an OPEN state.

In various embodiments of the invention, the current supply module 118 may be configured in an ON state when the contact switch 210 is configured in a CLOSED state. By contrast, the current supply module 118 may be configured in an OFF state when the contact switch 210 is configured in an OPEN state. The bias current for the current supply module 118, measured at the node S, may be represented as $I_k$.

Figure 3:
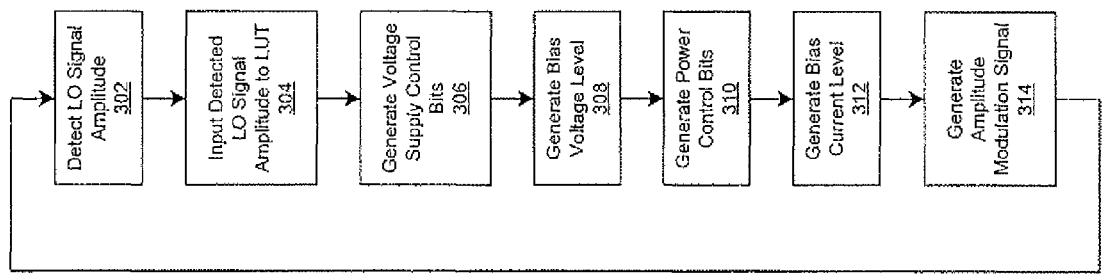
FIG. 3 is a flow chart illustrating exemplary steps for dynamic biasing and bias current control, in accordance with an embodiment of the invention.

FIG. 3 is a flow chart illustrating exemplary steps for dynamic biasing and bias current control, in accordance with an embodiment of the invention. Referring to FIG. 3, in step 302 the envelope detector 116 may detect the amplitude of the differential input signal to the PA 123. In step 304, the envelope detector 116 may send a signal to the LUT 114, which indicates the amplitude of the differential input signal. In step 306, the LUT 114 may generate supply control bits based on the input amplitude information received in step 304. In step 308, the DC/DC converter 112 may dynamically set a bias voltage level for $V_{Bias}$, based on the supply control bits received in step 406. The magnitude of the bias voltage level may be less than or equal to the magnitude of the supply voltage level $V_{DD}$.

In step 310, the processor 130 may enable generation of power control bits $B_0, B_1, \ldots,$ and $B_{N-1}$. In step 312, based on the power control bits generated in step 310, the current source 119 may enable generation of an aggregate bias current level, $I_{Bias}$, which may flow through the PA 123. In step 314, an input modulation signal may be applied to the current source 119. In an exemplary polar modulation PA system, the modulation signal may comprise an amplitude modulation signal. The amplitude modulation signal may control the amplitude of the output signal from the PA 123, measured between nodes $D_1$ and $D_2$, for example.

In various embodiments of the invention, the bias voltage level may be dynamically adjusted during circuit operation in response to changes in the amplitude of the differential input signal to the PA 123. In addition, the bias current may also be dynamically adjusted. In this regard, step 302 may follow step 314.

While FIG. 1 shows the filter 124 located within the die 106, and the matching transformer 108 and antenna 110 located within the package 104, various embodiments of the invention may not be so limited. In various embodiments of the invention, the filter 124 may be located within the package 104 and/or within the board 102. Similarly, the transformer 108 and/or antenna 110 may be located within the board 102.

Aspects of a system for improving efficiency over power control for linear and class AB power amplifiers may include a current source circuit 119 that enables determination of a bias current level for a PA circuit 123 within an IC die 106 based on an amplitude of an input modulation signal. The PA circuit 123 may enable generation of an output signal based on a differential input signal, LO+ and LO−, and the input modulation signal to the current source circuit 119. A generated bias voltage may be applied to a transformer 108 external to the IC die 106 but internal to an IC package 104 containing the IC die 106 and/or a circuit board 102 containing the IC package. One or more amplifier bias voltage levels may be applied to the PA circuit 123 wherein the amplifier bias voltage levels may be derived from the generated bias voltage level and/or the determined bias current level.

The DC/DC converter 112 may enable dynamic generation of a subsequent bias voltage level based on a subsequent amplitude of the input modulation signal. The LUT 114 may enable selection of the generated bias voltage level. The current source circuit 119 may enable dynamic generation of a subsequent bias current level based on a subsequent amplitude of the input modulation signal.

In an exemplary polar modulation system, the differential input signal may comprise signal phase information, and the input modulation signal may comprise signal amplitude information. The phase of the generated output signal from the PA circuit 123 may be based on the differential input signal, and an amplitude of the generated output signal may be based on the input modulation signal.

The input modulation signal may be input to the current source circuit 119. The current source circuit 119, which may comprise a plurality of current supply modules 118, may generate the bias current level. The generated bias current level may be a total bias current level summed across the plurality of current supply modules 118 within the current source circuit 119.

The current source circuit 119 may be configured based on a power control bits signal. Each of the plurality of current supply modules 118 may be controlled based on a corresponding bit in a power control word received via the power control bits signal. The power control word may comprise bits $B_0, B_1, \ldots, B_{N-1}$, for example. The input modulation signal may be an input signal to each of the plurality of current supply modules 118.

The output signal from the PA circuit 123 may be based on the input signal to each of the plurality of current supply modules 118, which is configured in an ON state. Each of the current supply modules 118 may be configured in an ON state of an OFF state based on the corresponding bit in the power control word.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A wireless communication system comprising:
a circuit that enables determination of a bias current for an amplifier in said wireless communication system based on an input modulation signal;
said amplifier generating an output signal based on a differential input signal to said amplifier and said input modulation signal;
wherein at least one amplifier bias voltage is derived from said bias current, and wherein said at least one amplifier bias voltage is applied to said amplifier.

2. The wireless communication system of claim 1, wherein said differential input signal comprises signal phase information.

3. The wireless communication system of claim 1, wherein said input modulation signal comprises signal amplitude information.

4. The wireless communication system of claim 1, wherein a phase of said output signal is based on said differential input signal.

5. The wireless communication system of claim 1, wherein an amplitude of said output signal is based on said input modulation signal.

6. The wireless communication system of claim 1, wherein a phase of said output signal is based on said differential input signal, and an amplitude of said output signal is based on said input modulation signal.

7. The wireless communication system of claim 1, wherein said differential input signal comprises signal phase information, and wherein said input modulation signal comprises signal amplitude information.

8. The wireless communication system of claim 4, wherein said differential input signal comprises signal phase information.

9. The wireless communication system of claim 5, wherein said differential input signal comprises signal phase information.

10. The wireless communication system of claim 4, wherein said input modulation signal comprises signal amplitude information.

11. The wireless communication system of claim 5, wherein said input modulation signal comprises signal amplitude information.

12. The wireless communication system of claim 1, wherein said input modulation signal is inputted to a current supply.

13. The wireless communication system of claim 12, wherein said current supply generates said bias current.

14. A method for amplifying signals in a wireless communication system, said method comprising:
   determining a bias current for an amplifier based on an input modulation signal;
   generating an output signal from said amplifier based on a differential input signal to said amplifier and said input modulation signal;
   deriving at least one amplifier bias voltage from said bias current;
   applying said at least one amplifier bias voltage to said amplifier.

15. The method of claim 12, wherein said differential input signal comprises signal phase information.

16. The method of claim 12, wherein said input modulation signal comprises signal amplitude information.

17. The method of claim 12, wherein a phase of said output signal is based on said differential input signal.

18. The method of claim 12, wherein an amplitude of said output signal is based on said input modulation signal.

19. The method of claim 12, further comprising providing said input modulation signal to a current supply.

20. The method of claim 19, wherein said current supply generates said bias current.

\* \* \* \* \*